(12) United States Patent
Batra

(10) Patent No.: US 10,592,701 B2
(45) Date of Patent: Mar. 17, 2020

(54) VISUALLY DEPICTING RELATIONSHIPS BETWEEN PARTS OF A CONCEPT DESIGN

(71) Applicant: Oracle International Corporation, Redwood Shores, CA (US)

(72) Inventor: Anurag Batra, Union City, CA (US)

(73) Assignee: Oracle International Corporation, Redwood Shores, CA (US)

( * ) Notice: Subject to any disclaimer, the term of this patent is extended or adjusted under 35 U.S.C. 154(b) by 161 days.

(21) Appl. No.: 15/285,395

(22) Filed: Oct. 4, 2016

(65) Prior Publication Data

US 2017/0024494 A1    Jan. 26, 2017

Related U.S. Application Data

(63) Continuation of application No. 13/354,274, filed on Jan. 19, 2012, now Pat. No. 9,483,584.

(51) Int. Cl.
*G06F 15/16* (2006.01)
*G06F 30/00* (2020.01)

(52) U.S. Cl.
CPC .................. *G06F 30/00* (2020.01)

(58) Field of Classification Search
CPC ..................................... G06F 17/50
See application file for complete search history.

(56) References Cited

U.S. PATENT DOCUMENTS

| 7,814,429 | B2 | 10/2010 | Buffet et al. |
| 8,738,543 | B2 | 5/2014 | Forbes et al. |
| 8,806,355 | B2 | 8/2014 | Twiss et al. |
| 9,349,200 | B2 | 5/2016 | Cardno |
| 9,454,623 | B1 | 9/2016 | Kaptsan |
| 2008/0077902 | A1* | 3/2008 | Harashima ............. G06F 17/50 716/119 |
| 2010/0063900 | A1* | 3/2010 | Hathaway .......... G06Q 30/0282 705/26.1 |
| 2011/0213639 | A1* | 9/2011 | Stacklin ............... G06Q 10/067 705/7.31 |
| 2013/0066601 | A1* | 3/2013 | Palanivel ................ G06F 17/50 703/1 |

* cited by examiner

*Primary Examiner* — Ryan J Jakovac
(74) *Attorney, Agent, or Firm* — Trellis IP Law Group, PC

(57) ABSTRACT

In a method, system, apparatus, and computer-readable device having instructions for collaboration within a visualization application, a visualization application is used to display a visualization for at least a portion of an object, wherein the object comprises a plurality of parts, a request is received to display collaboration data for a part of the object using the input device, information is received about a part, wherein the information comprises details about the part, an association between collaboration data and visualization data for a part of an object is retrieved and the collaboration data comprises data input by one or more to be associated with the part of the object, and information is displayed about a part and collaboration data associated with the visualization for the part of the object.

20 Claims, 16 Drawing Sheets

VISUALLY DEPICTING RELATIONSHIPS BETWEEN PARTS OF A CONCEPT DESIGN

CROSS REFERENCES TO RELATED APPLICATIONS

This application is a continuation of the following application, U.S. patent application Ser. No. 13/354,274 entitled COLLABORATION WITHIN VISUALIZATION APPLICATION, filed on Jan. 19, 2012, which are hereby incorporated by reference, as if set forth in this application of all purposes.

This application is related to the following application, U.S. Pat. No. 9,348,967, entitled "Overlaying Business Intelligence Data on a Product Design Visualization,", issued on May 24, 2016, which is hereby incorporated by reference, as if set forth in this application of all purposes.

BACKGROUND

When an engineer is designing a product, the engineer may select from an almost limitless number of component options. So, the engineer must constantly evaluate different component options in the course of building a product and take into consideration the tradeoffs inherent with selection of each option. For example, the engineer may consider whether the part breaks easily, costs too much, affects the balance of the product, or fits in with a model of the product.

Analytical information regarding components is often used to evaluate the component. The information for a component is typically conveyed with the use of charts or tables. The charts and tables may adequately convey the data for the components used in the product but do not provide a sufficiently intuitive visual representation of how the data is distributed across the overall product. For example, if a bicycle is made of fifty components, a tabular display with actual weights for each component, a comparison to target weights for each component, and a listing of part names within the table which are underweight and overweight may be displayed to provide a view of the parts that need attention.

However, the charts and tables give no indication of where the weight may be skewed in relation to the whole product. One must guess at the overall impact on the product for using particular parts from the attributes captured in data in tables or charts. In particular, the problem is that the data is just numbers and it is impossible to tell from the data on each individual part in pie charts and tables if the overall product is heavier toward back or front until built. A user may have to actually scan a list of individual parts and guess at an imbalance in a constructed product in order to actually grasp the relative seriousness of each part's weight deviation. Accordingly, it is desirable to provide a technique for improved presentation of product data.

SUMMARY

In a method, system, apparatus, and computer-readable device having instructions for collaboration within a visualization application, a visualization application is used to display a visualization for at least a portion of an object, wherein the object comprises a plurality of parts, a request is received to display collaboration data for a part of the object using the input device, information is received about a part, wherein the information comprises details about the part, an association between collaboration data and visualization data for a part of an object is retrieved and the collaboration data comprises data input by one or more to be associated with the part of the object, and information is displayed about a part and collaboration data associated with the visualization for the part of the object.

A further understanding of the nature and the advantages of particular embodiments disclosed herein may be realized by reference of the remaining portions of the specification and the attached drawings.

BRIEF DESCRIPTION OF THE DRAWINGS

FIG. 8 illustrates an example of a user interface for managing object data.

FIG. 10 illustrates an example of a user interface with a rendering of a visualization of an object concept.

FIG. 11 illustrates an example of a user interface with a rendering of a visualization of an object concept with overlays of object data.

FIG. 12 illustrates an example of a user interface for an implementation of collaboration within a visualization application.

FIG. 13 illustrates an example of a user interface for an implementation of collaboration within a visualization application.

DETAILED DESCRIPTION OF EMBODIMENTS

Figure 1:
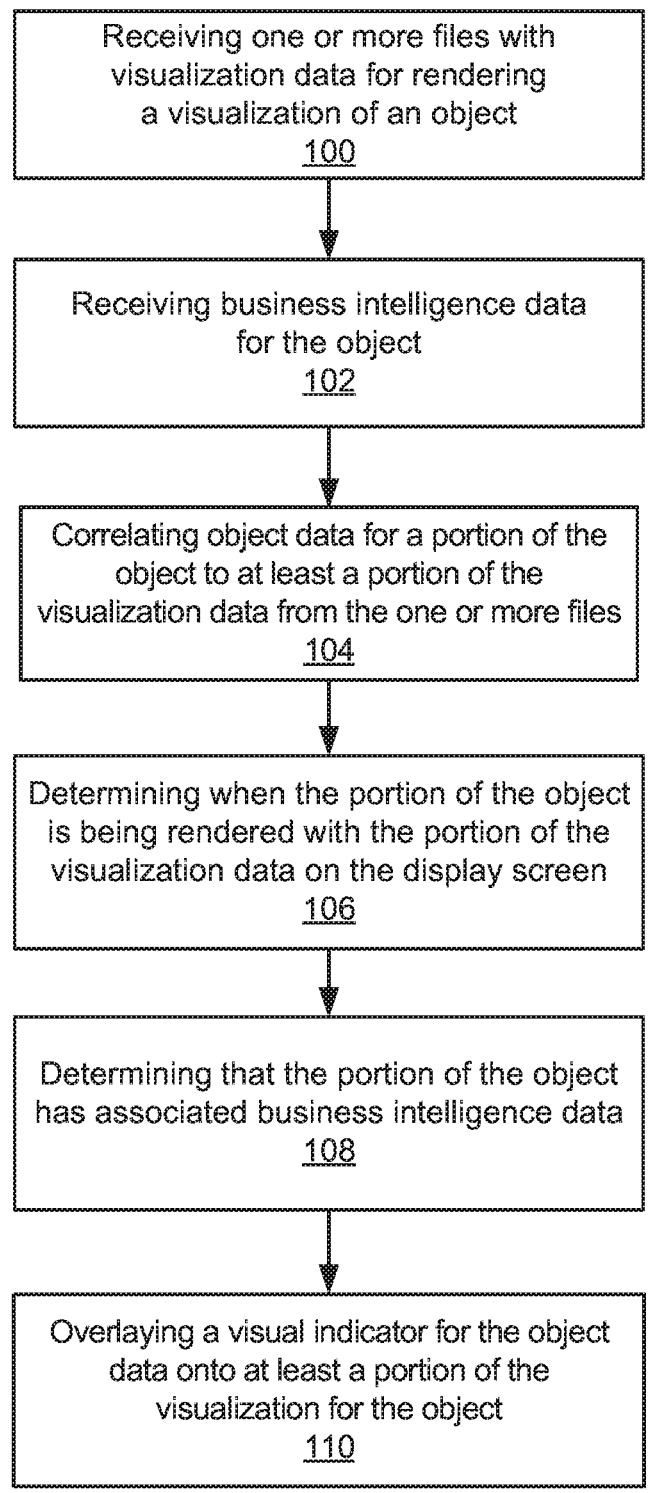
FIG. 1 illustrates a flow chart with an example of an implementation of overlaying product information and/or business intelligence data on a product design visualization.

Systems, methods, apparatuses, computer readable devices, and computer program products are described for adding product information and/or business intelligence data to a product design visualization. Embodiments may provide an overlay of a visual indicator for object data (e.g. product information and/or business intelligence data) onto a visualization of an object. In an embodiment, the object may be a product and/or a concept or a prototype for a product. It may be desirable to view the visualization of an object as a soft copy of a product. The visualization may be a rendering of a 2-dimensional or 3-dimensional model for a prototype of the product.

A visual indicator for object data may be overlayed onto a portion of the visualization for a design of an object. The object data may be product information and/or business intelligence data for the concept of the product. Business intelligence may refer to techniques used in identifying, extracting, and analyzing data, such as information on products. Business intelligence data may transform raw data into meaningful and useful information and may be conveyed using visual representations such as pie charts. It may be desirable to view an overlay of object data visual indicators on the visualization to make determinations about the product, including, but not limited to, the following: where the product may break easily, where in the design costs have been exceeded, to detect an imbalance, evaluate a fit for a particular part in a product, strategic decisions, operations, and/or any other decisions regarding an object.

The presentation of the object data with an overlay of a visual indicator of the data on a visualization of a product may allow a user to evaluate the impact of using particular parts on the overall product. It may be desirable to think of a visualization with overlays of visual indicators for object data for particular data as providing a particular "view" of the visualization for the object. For example, it may be possible for the user with a "weight" view (e.g. view of visualization with weight object data) to tell whether a particular product is heavier toward the back or front with a heat map visual indicator on the product indicating the weight of each individual part of the product.

The object data may be associated with at least a portion of a visualization of a design for an object. For example, the portion of the visualization data may be a portion of one or more Computer Aided Design (CAD) files for one or more parts of the object. Continuing with the example, the object data may be associated with an assembly file (e.g. a CAD file with a .asm file extension) that may contain assembly instructions for one or more parts and/or a visualization file that contains visualization data for a single part. The object data pertaining to a part may be associated with a file that contains visualization data for the corresponding part of the object.

The associations between the visualization data and object data may form a mapping that can be referenced for rendering the visualization with the overlay of the visual indicators. In an embodiment, the mapping may be referenced to facilitate the creation of one or more new visualization data files containing the visualization data with the overlay of visual indicators. For example, a copy of the original visualization files may be created and visualization data for rendering the overlay may be added to the copy to allow for rendering a particular view of the visualization with an overlay for the object data in accordance with the mapping. Continuing with the example, visualization data for a visual indicator may be added to a copy of the original CAD files. The new files may be used to render the visualization with an overlay of visual indicators for object data on the actual cost of particular parts in comparison to the expected costs. Although a description is provided with the generation of new visualization files to create a visualization with overlays of visual indicators for object data using the mapping, those with skill in the art will recognize that there are other methods or techniques that may be used, such as generating or rendering the visualization with visual indicators without creating new files.

In one or more embodiments, collaboration data may be displayed with at least a portion of the visualization for an object. The collaboration data may be associated with at least a portion of the visualization data for an object (e.g. associated with at least a portion of one or more CAD files). For example, the collaboration data for a particular part may be associated with visualization data for the particular part. The associations may form a mapping that can be referenced to generate visualizations with collaboration data. The object may be a concept for a product design and the collaboration data may be commentary on the design choices for the product design. Users can share collaboration data related to parts of the design and the collaboration data can be directly associated with the part such that the collaboration data shared by users for a particular part can be displayed upon request by a user with the part. For example, collaboration data shared with a particular part of a product in a visualization can be associated with the part, and be displayed when requested with the particular part and/or group of parts where the particular part may be a part of the grouping of parts.

FIG. 1 illustrates a flow chart with an example of an implementation of overlaying product information and/or business intelligence data on a product design visualization. One or more visualization data files with visualization data for rendering a visualization of an object may be received (100). The visualization data files may be, for example, CAD files that have a hierarchical structure. The CAD files may indicate to a CAD system or any other visualization software how to assemble a visualization for an object (e.g. a product). In the simplest case, the visualization data files may consist of separate data files for each part of a product and the data files may be assembled to produce a visualization of the product.

Business intelligence data for the object may be received (102). Business intelligence data may be received and/or stored in any number of ways, including, but not limited to, the following: one or more files, stored in a database, a hierarchy of files (e.g. a directory of files), and/or any other way to store and receive data.

Business intelligence data for a portion of the object may be correlated with at least a portion of visualization data from the one or more visualization data files (104). Object data and/or business intelligence data may be correlated with the visualization data for the object. Object data may be business intelligence data, product data or information, and/or any other object data for at least a portion of the object. For example, the product business intelligence data for a particular part of a concept for an object may be correlated with the corresponding visualization data for the part (e.g. a CAD file for the part). The correlation may consist of associating the visualization data and object data for the part in a database table. For example, a table in a database may store correlations between visualization data and object data. Continuing with the example, the table may have columns for visualization data and object data, and each row of the table may reflect the association between the visualization data and object data for the part.

In an embodiment, a mapping is determined between one or more CAD files for the product to the business intelligence data. For example, a CAD file for a part may be mapped to a file containing business intelligence data for the same part. In another example, a file with assembly instructions for rendering a group of parts in a visualization (e.g. bicycle handlebars) may be associated or mapped to business intelligence data for the group of parts (e.g. bicycle handlebar information). A portion of a CAD file (e.g. a programming construct of a pointer to a portion of a file) may be mapped to a portion of business intelligence file and/or a rows or columns in a database. A determination may be made as to when the portion of the object is being rendered with the portion of the visualization data on the display screen (106). A visualization for an object may be displayed. The object may be a product, product concept, and/or any other object that can be in rendered for a visualization. For example, the visualization may be a 2-dimensional or 3-dimensional model. In an embodiment, the visualization may be a rendering of a CAD design using data from one or more CAD files. A determination may be made as to whether the portion of the object has associated business intelligence data (108). A mapping for the visualization may be retrieved to determine the associated business intelligence data for the portion of the visualization data being displayed. For example, a table may be queried to determine whether the portion of the object has associated business intelligence data.

A visual indicator for the business intelligence data may be overlayed onto at least a portion of the visualization for the object (110). A visual indicator may include, but is not limited to, the following: a particular color, shading, cross hatching, text, an image, and/or any other visual indicator for at least a portion of the visualization for the object. In an embodiment, the visual indicator may be a particular color for generation of a heat map overlayed onto the visualization of a product to indicate the parts of the design that are not on target. For example, the object data may relied on for the assignment of colors to visually indicate whether a weight for a particular part is overweight (e.g. red), underweight (e.g. blue), or on target (e.g. green).

Figure 2:
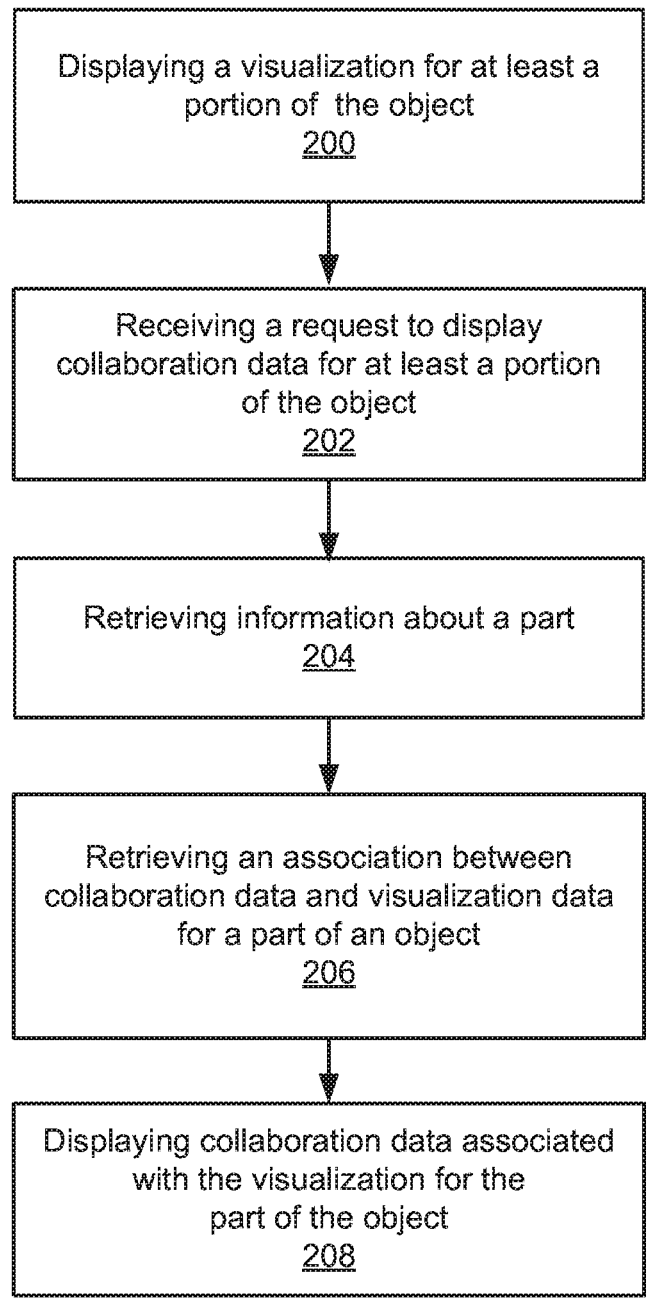
FIG. 2 illustrates a flow chart with an example of an implementation of collaboration within a visualization application.

FIG. 2 illustrates a flow chart with an example of an implementation of collaboration within a visualization application. A visualization for at least a portion of the object may be displayed (200). A 2-dimensional or 3-dimensional model for the object (e.g. product) may be displayed within a visualization software application. The object may comprise of a plurality of parts. For example, the object may be a product with one or more parts or components.

A request to display collaboration data for at least a portion of the object may be received (202). A user may select to display the collaboration data associated with the portion of the object for the request. For example, the user can request the selection of collaboration data for a particular part by hovering over a particular part and selecting the part with a mouse click. In another example, a user can select a particular portion of an object with a touch screen. Those with skill in the art will recognize that there are many ways to select a portion of an object for display of the corresponding collaboration data.

Information may be retrieved on the part (204). Information on the part may include, but is not limited to the following: part specifications, design information, and/or any data or details relevant to the part.

An association between collaboration data and visualization data may be retrieved (204). Collaboration data may be associated with visualization data for an object. Collaboration data may be data shared by one or more users. Collaboration data may be text, images, and/or any other content a user chooses to share. The collaboration data may be associated with the visualization data for an object.

In an embodiment, the collaboration data shared by a user and designated as related to a portion of the object may be associated with the visualization data for the portion of the object. For example, the collaboration data shared by a user related to a particular part of a product may be associated or mapped to a CAD file for the part of the product.

In another embodiment, collaboration data may be mapped to visualization data for a particular view of the visualization. For example, collaboration data may be mapped to visualization data with visual indicators for object data representing a "cost" view (e.g. actual cost vs. expected target costs) with colors of blue for under target, red for under target, and green for on target.

Collaboration data for the part of the object may be displayed with the visualization for the object (208). Collaboration data may be displayed alongside a particular part of the object in the visualization. Collaboration data may consist of user's thoughts on particular parts and/or suggestions for replacement of parts.

In an embodiment, a recommendation engine may be provided for displaying options for parts discussed in the collaboration data. Alternative parts may be displayed for selection by users to replace particular parts discussed in the collaboration data. Embodiments may allow for the selection and redisplay of the visualization with a selected part and the user may be able to begin the process of ordering the part using the user interface for the visualization.

Figure 3:
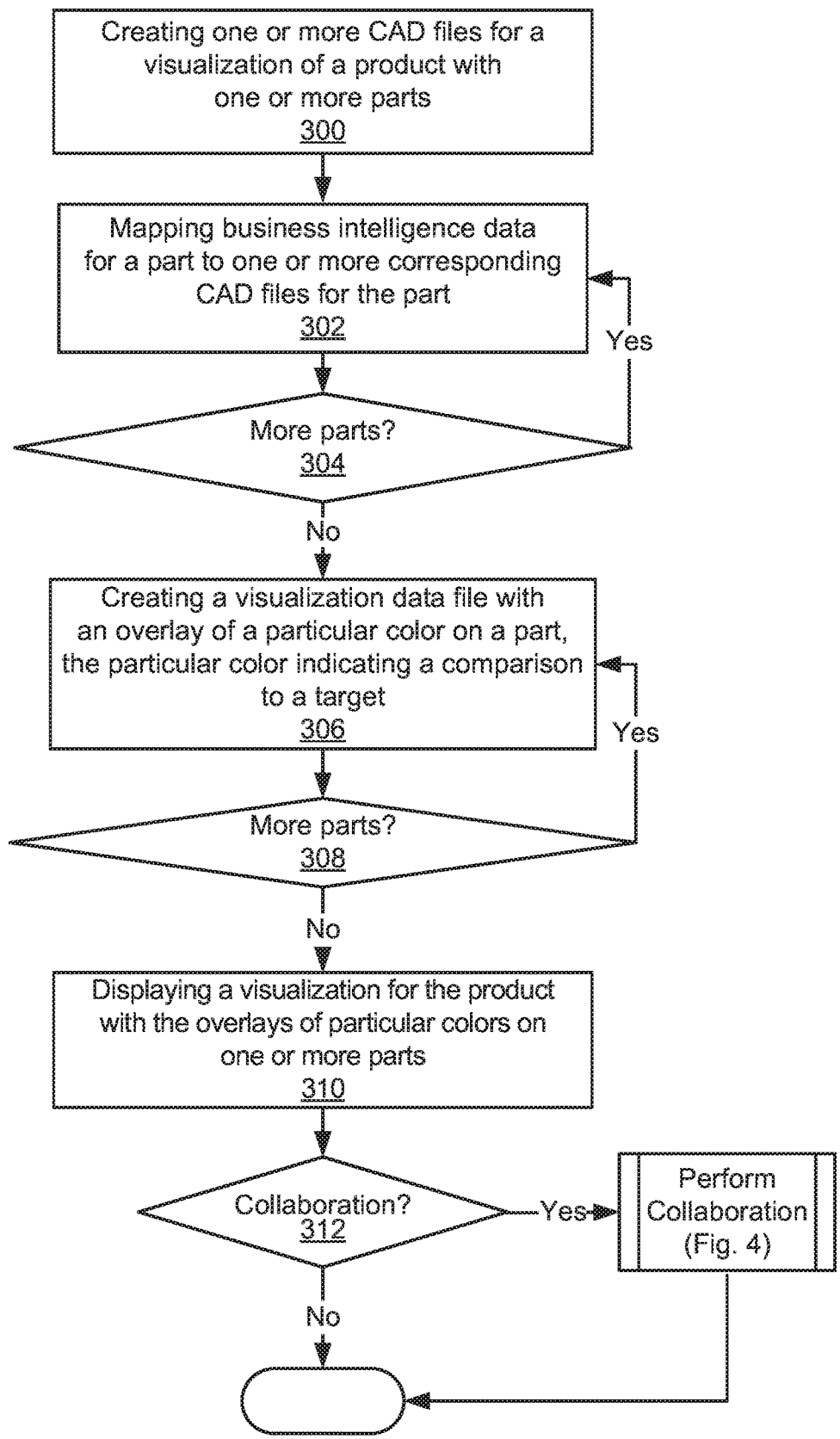
FIG. 3 illustrates a flow chart with an example of an implementation of overlaying product information and/or business intelligence data on a product design visualization.

FIG. 3 illustrates a flow chart with an example of an implementation of overlaying product information and/or business intelligence data on a product design visualization expanded overlay with collaboration. One or more CAD files may be created for a visualization of a product concept that has one or more parts (300). The CAD files may have a hierarchical structure that indicates to a CAD system or visualization software how to assemble the product visualization. The CAD files may have assembly files (e.g. .asm files) for assembling parts and part files for particular parts (e.g. .prt files). Any level of granularity is possible for each file containing visualization data.

The business intelligence data for a part may be mapped to one or more corresponding CAD files for the part (302). The mapping for a visualization may have object data (e.g. business intelligence data) for one or more parts (e.g. parts, groups of parts for assembly) associated with one or more CAD files (e.g. visualization data). Although an example is provided in FIG. 3 for mapping part object data to visualization data for a part, those with skill in the art will recognize that any level of granularity (e.g. part, group of parts, etc.) may be used for providing a mapping of object data to visualization data. Business intelligence data may continue to be mapped to CAD files for parts until there are no more parts to map (304).

A visualization data file may be created for a part with an overlay of a particular color to indicate a comparison to a target (306). An overlay of the particular color may indicate business intelligence data for the part (e.g. the actual data for a part of a product concept in comparison to a target for the part). In an embodiment, the CAD file for the part may be used to create a new visualization data file. The new visualization file may be created in order to place an overlay of a particular color on the visualization to provide a visual indicator for the business intelligence data for the part. In another embodiment, additional files may be created containing the overlay visualization data and both the original CAD files and overlay visualization files may be used to render the visualization. New visualization data files with visual indicators for the business intelligence data may be created for any number of parts (308) until there are no more parts to process.

A visualization for the product may be displayed with the overlays of particular colors on one or more parts (310). The new visualization files may be used to render the parts with the overlays of visual indicators. For example, business intelligence data for a bicycle concept parts may include, but is not limited to, the following: applicability for use by children, expected manufacturing cost, weight, and/or any other factor for evaluating parts. The visualization with the visual indicators for business intelligence data may provide a user with a visual way of narrowing down a problem and solving it.

The user may then decide to collaborate with other users regarding the visualization (312). If the user desires to collaborate, then collaboration is performed, as described below with FIG. 4. Alternatively, the process ends.

Figure 4:
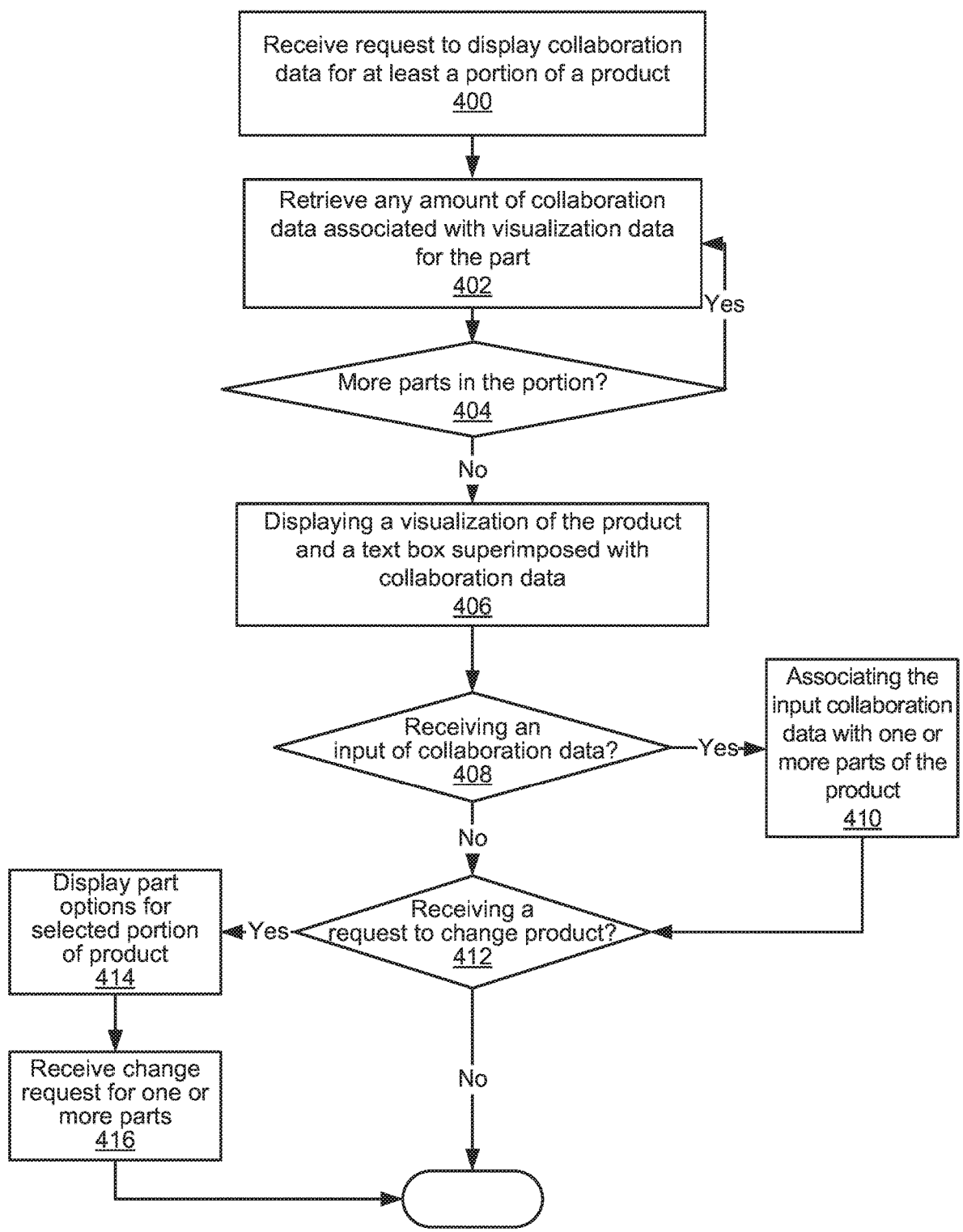
FIG. 4 illustrates a flow chart with an example of an implementation of collaboration within a product design visualization.

FIG. 4 illustrates a flow chart with an example of an implementation of collaboration within a product design visualization. A request may be received to display collaboration data for at least a portion of a product (400). Any number of parts or grouping of parts of a product may be selected for display of collaboration data. For example, the user may highlight and select a group of parts on a visualization of the product.

Any amount of collaboration data associated with the visualization data for a part may be retrieved (402). A mapping is provided between the collaboration data for a part and a visualization data file used to display the visualization for the product. When a user selects a part within the visualization for the product, the visualization data file can be used as a key to retrieve the corresponding collaboration data. Collaboration data may be retrieved for all parts within the selected portion (404) until there are no more parts selected for which collaboration data needs to be retrieved.

A visualization of the product may be displayed and a text box, visual card, or any other user interface element may be superimposed on the visualization with collaboration data (406). The collaboration data may be displayed for all of the selected parts. In an embodiment, a particular view (e.g. a "cost" view or "weight" view) of the visualization may be displayed and collaboration data may be associated with that particular view.

An input may be received for more collaboration data (408). For example, a user may desire to comment on a selected part of the product design. If the user inputs collaboration data, then the inputted collaboration data may be associated with one or more parts of the product (410). The associated inputted collaboration data may be retrieved when a user requests the collaboration data for the part. Alternatively, no input may be received for collaboration data (408).

A request may be received to change the product (412). Part options for the selected portion of the product may be displayed to the user (414). A recommendation engine may be used to present the part options to the user. A change request may be received for one or more parts (416). Alerts may be sent to one or more users with the change request information.

Figure 5:
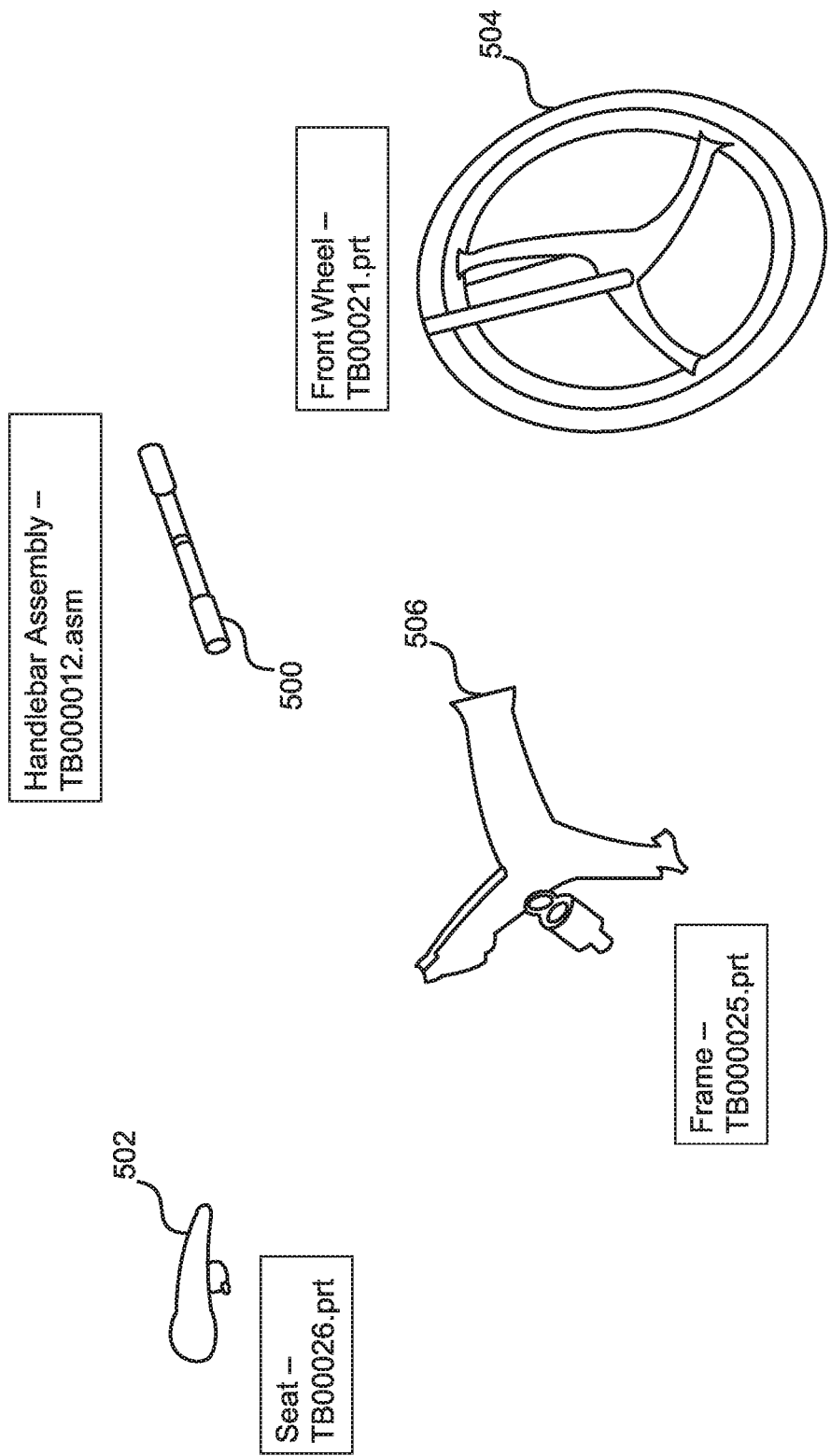
FIG. 5 illustrates an example of a visualization for a product design.

FIG. 5 illustrates an example of a visualization for a product design. In FIG. 5, the following portions of a visualization for a product design are displayed: 500 Handlebar Assembly, 502 Seat, 504 Front Wheel, and 506 Frame. Product designers or any other user may create one or more files for rendering the visualization of a product. For example, the product designers may create a visualization that is a CAD drawing composed of one or more files.

The visualization may be composed of one or more files that have a particular structure in order to render the visualization, such as the files may have a particular order and sequence. Each part may have a corresponding CAD file (e.g. file with .prt file extension) with visualization data. As shown in FIG. 5, parts 502 Seat, 504 Front Wheel, and 506 Frame have files with visualization data, as follows: 502 Seat with file TB00026.prt, 504 Front Wheel with file TB00021.prt, and 506 Frame with file TB00025.prt. The assembly of a product for the visualization may be provided in an assembly file (e.g. file with .asm file extension). For example, the Handlebar Assembly 500 may have a file TB000012.asm that provides visualization data for the assembly of a portion of the product that may have one or more parts.

Figure 6:
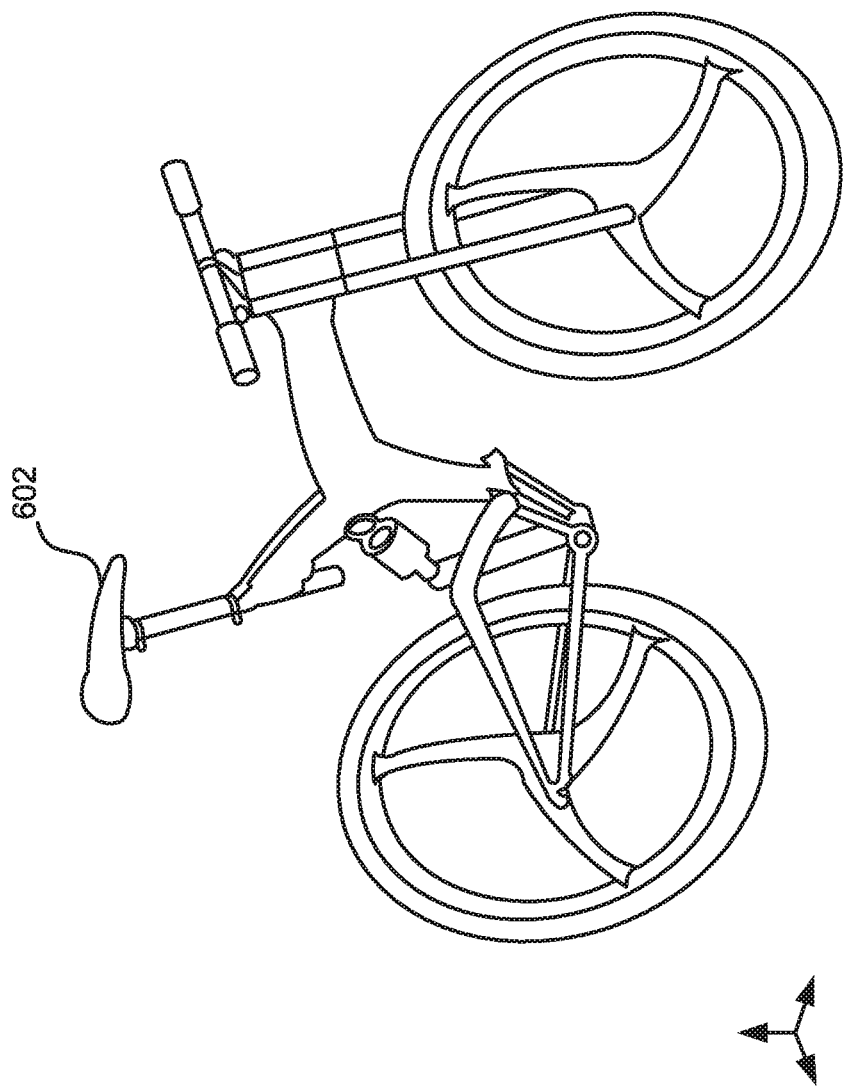
FIG. 6 illustrates an example of a visualization for a product design.

FIG. 6 illustrates an example of a visualization for a product design. Product designers can use a CAD system to build and assemble drawings of the various parts. It may be desirable to view the visualization as a soft copy of the product. A hierarchical collection of files (e.g. a file structure), such as shown in FIG. 6 with 600, may be used to assemble the visualization for the product. The file structure illustrated in FIG. 6 displays assembly files that provide assembly instructions for using the .prt files and/or .asm files listed on lines that are displayed indented and underneath the particular .asm file. For example, TB00011.asm in FIG. 6 is composed of .asm files: TB00012.asm, TB00016.asm, TB00020.asm, and TB00024.asm. Continuing with the example, TB00012.asm is composed of files: TB00013.prt, TB00014.prt, and TB00015.prt. The CAD system can use the hierarchical collection of files Visualization Data Files 600 to render the visualization for the product (e.g. the bicycle), as shown in FIG. 6 with 602. For example, the bicycle 602 may be assembled with visualization data files displayed at 600.

Figure 7:
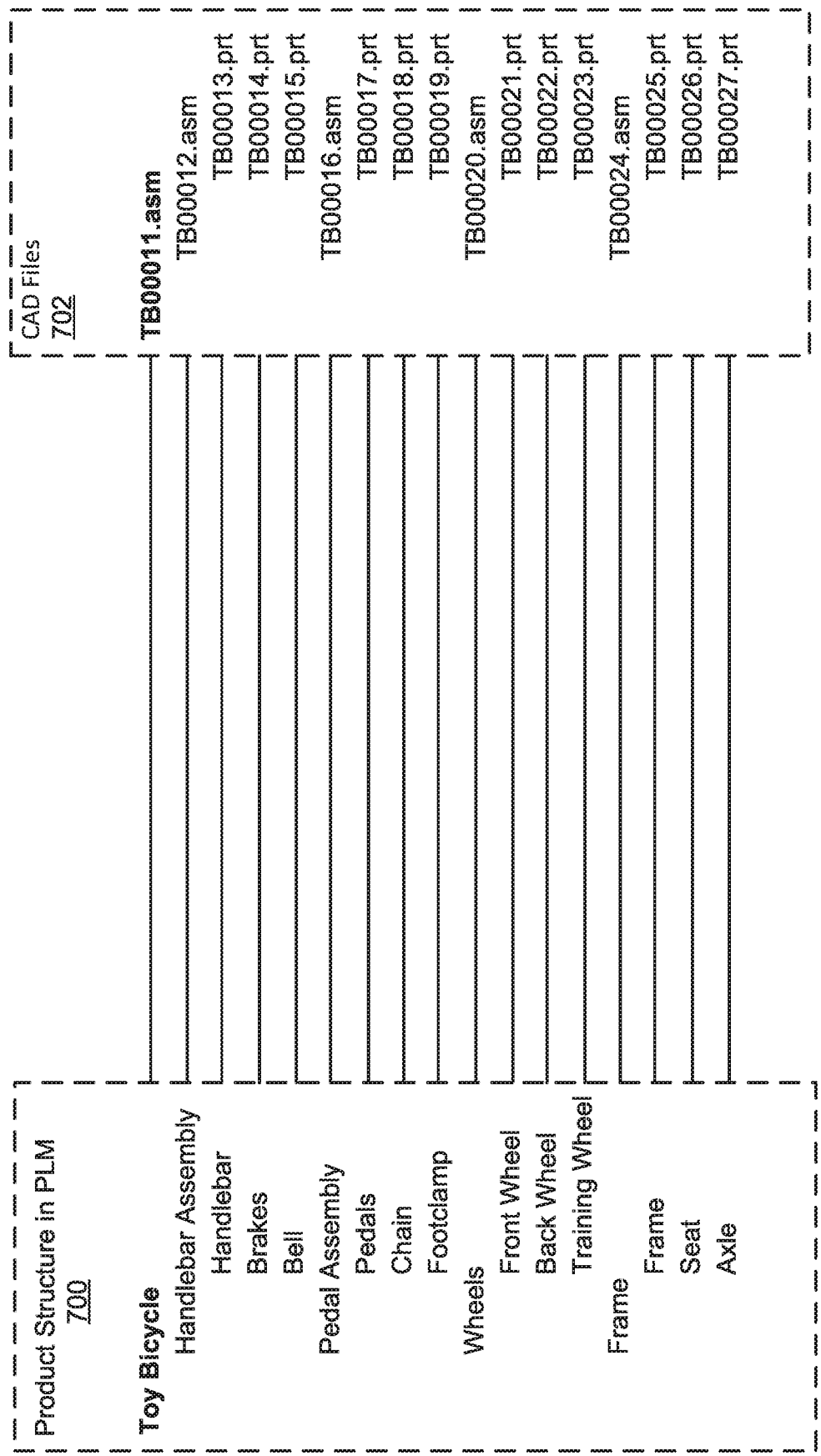
FIG. 7 illustrates an example of a mapping of object data to object visualization data.

FIG. 7 illustrates an example of a mapping of object data to object visualization data. In FIG. 7, object data 700, entitled "Product Structure PLM," is mapped to object visualization data 702, entitled "CAD Files." In an embodiment, design engineers may manage information, such as object data, about parts used in a software application, such as the Oracle Agile Product Lifecycle Management application. The object data may be stored as a "Bills of Material" and/or a "Conceptual Product Structure," as shown in FIG. 7 with "Product Structure PLM" 700. Each of the parts may have a number of characteristics and/or attributes stored and retrievable with a software application, such as object data, including, but not limited to, weight, cost, max speed, color, and/or compliance status, etc.

In an embodiment, the object data may be stored in the Product Lifecycle Management (PLM) system, a Manufacturing Execution System (MES), and/or an Enterprise Resource Planning (ERP) system. In a simplified representation as shown in FIG. 7, there may be a direct correspondence between object data for parts used in a "Product Structure PLM" and object visualization data files for parts in the CAD system. Although those with skill in the art will recognize that any mappings or associations may be used to create visualization with overlays of visual indicators for object data.

Figure 8:
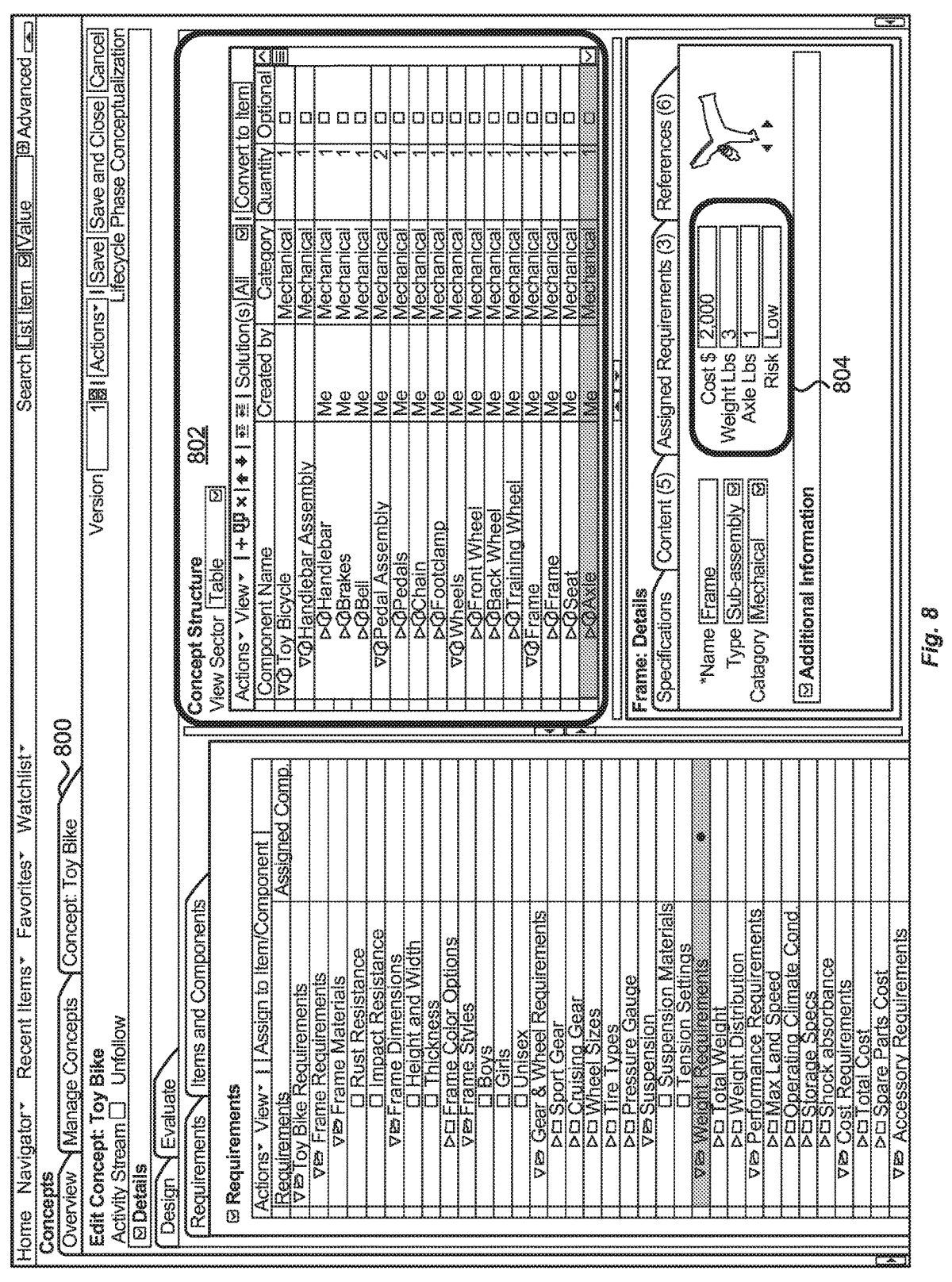

FIG. 8 illustrates an example of a user interface for managing object data. Object data may be business intelligence data and/or product information for a concept of a product. A software application may be used to manage the data and an example of a user interface for the software application is display in FIG. 8. In FIG. 8, object data for a product concept "Toy Bike" may be input and/or reviewed by selecting the tab for editing the product concept 800, entitled "Concept: Toy Bike." The user interface in FIG. 8 displays the product structure at 802 along with object data for the product concept part, such as attributes about individual parts. The object data for a particular part "Frame" (as noted with shading of the Axle part entry) is illustrated in FIG. 8 at 804. As shown at 804, the cost, Frame weight, Axle weight, and risk object data is provided for a Frame part for the "Toy Bike" product concept.

In an embodiment, the actual object data (e.g. cost, weight, power, and risk) for the object concept part may be compared to a target data for the product, and the difference between the actual data for the concept part and the target may be stored as business intelligence data associated with the part.

Figure 9:
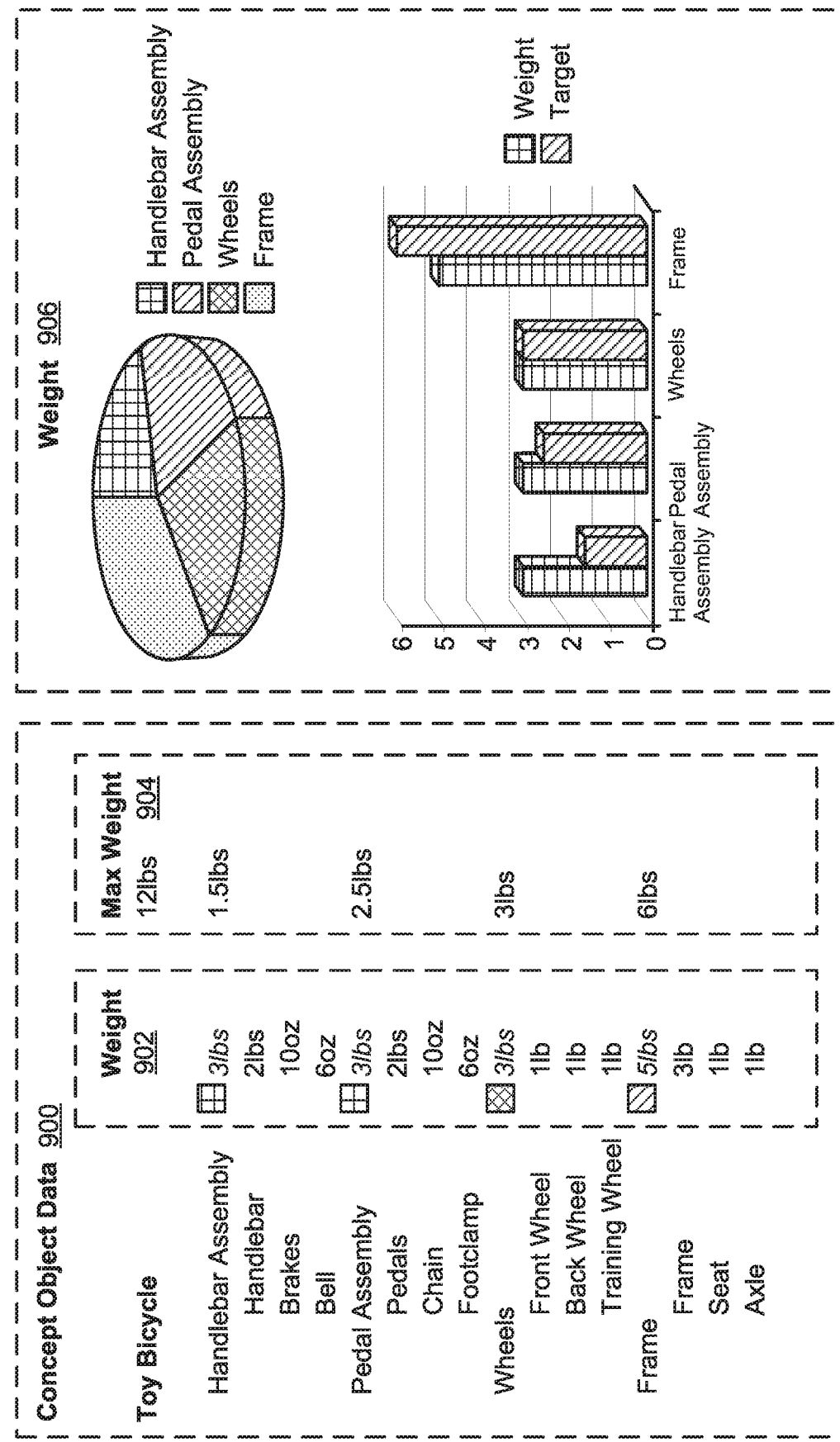
FIG. 9 illustrates an example of object data and visual representations of business intelligence data.

FIG. 9 illustrates an example of object data and visual representations of business intelligence data. The object data 900, entitled "Concept Object Data," for the object concept may be mapped to the visualization data (e.g. CAD files). Engineers may design the parts that may be used to produce the final product. The engineers may specify actual characteristics 902 (e.g. weight, cost, etc), for example, as illustrated "Weight," for those parts.

In an embodiment, a product manager or any other user may have specified constraints, such as total expected weight, "Max Weight" as illustrated at 904, cost for the overall product, and/or any other type of target. For example, the product level constraints specified by the product manager may be distributed across the product by designers and product managers. In the case of a bike, for example, although not illustrated, an even distribution of the weight in the front, middle and back may be preferred.

Actual values specified by engineers may be used to calculate subassembly level totals, which can be compared with targets. Color-coding or shading/crosshatching may be used to illustrate the results in pie charts and tables. Despite the use of shading/crosshatching, as illustrated at 906, with the representation of the data with the pie charts and tables may still be a very text-heavy representation of data and may be difficult to assimilate the results for decision-making. For example, looking at the table for "Weight" at 906, it may be very hard for the engineer to visualize where exactly the bike weight shifted.

Figure 10:
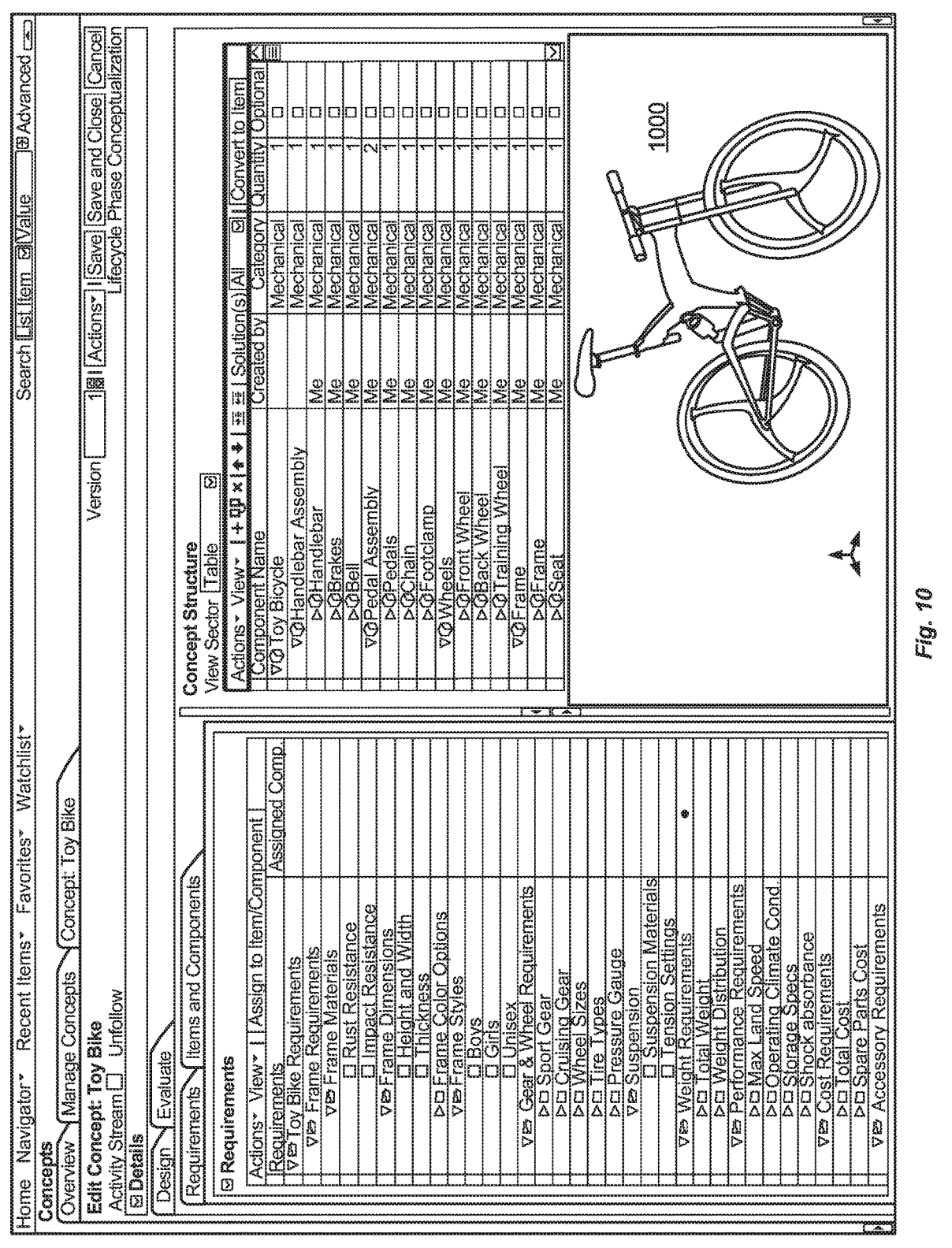

FIG. 10 illustrates an example of a user interface with a rendering of a visualization of an object concept 1000. In an embodiment, a reference to the CAD design may be stored for the product in PLM or any other software application. A plugin, such as Oracle AutoVue Enterprise Visualization Solutions (hereinafter "AutoVue"), may be used by the PLM application to read CAD files and render the design for an object concept similar to a CAD system. Although the software application PLM is provided in the description of embodiments, those with skill in the art will recognize that other types of software applications may be used to implement visualization with overlays of visual indicators for business intelligence data.

In an embodiment, AutoVue capabilities, such as "Heat Map," may be used to render the overlay of visual indicators representing business intelligence object data. Although AutoVue is provided as an example of a technology that may be used to implement overlaying object data visual indicators on a visualization for an object, those with skill in the art will recognize that there are a number of technologies that can be used to provide the overlaying of the visual indicators representing the business intelligence data.

In an embodiment, the use of a software application that manages both the business intelligence data and provides visualization rendering capabilities allows the user to drill down into the data using the visualization interface. For example, a user may select a part and display the data associated with the part.

Figure 11:
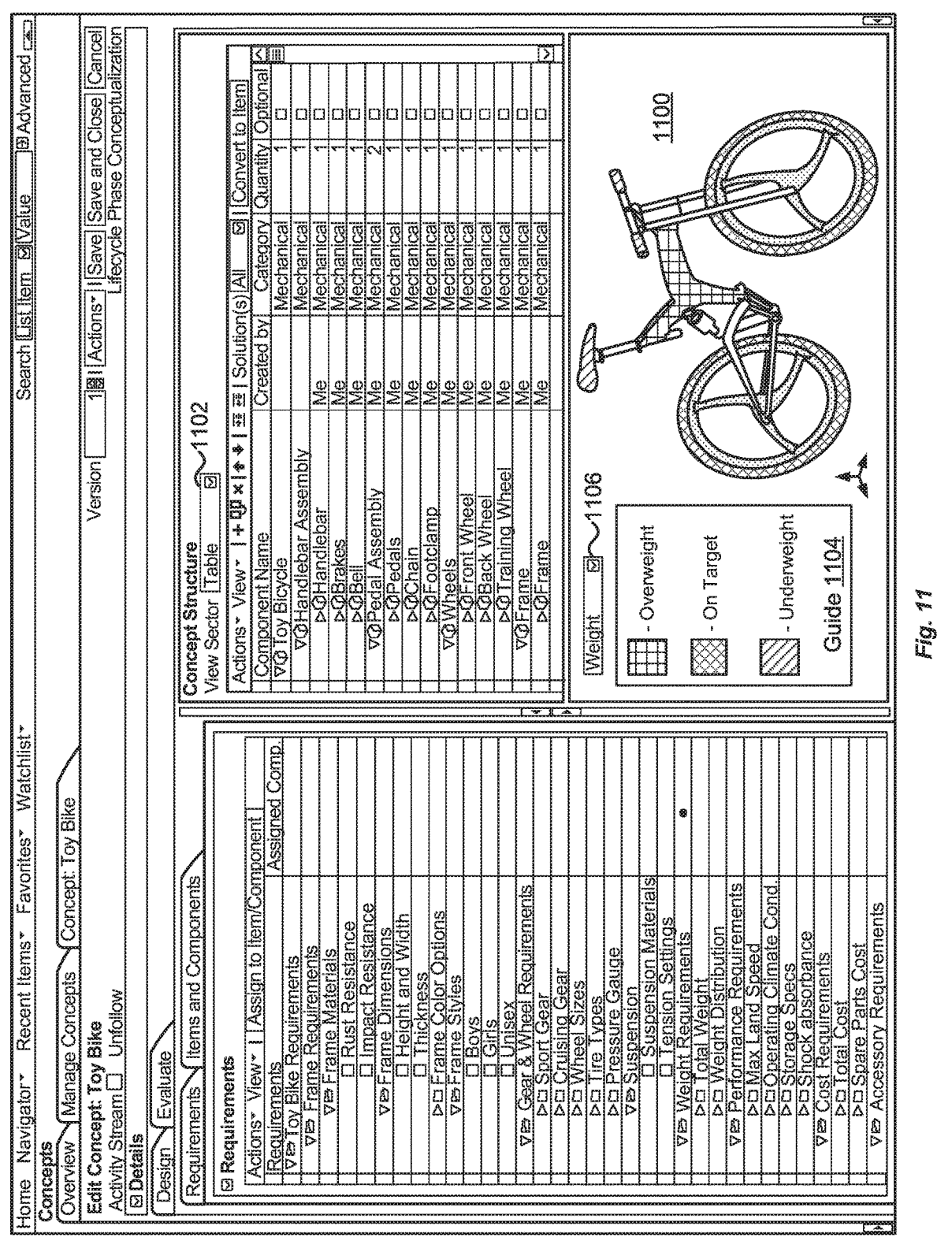

FIG. 11 illustrates an example of a user interface with a rendering of a visualization of an object concept with overlays of object data. FIG. 11 illustrates a user interface for a product concept 1102, entitled "Concept Structure," with a rendering of a visualization of an object concept 1100. The object concept 1100 has overlays of shading/crosshatching representing the object data (e.g. business intelligence data).

A guide 1104 is provided with the meaning corresponding to shading/crosshatching visual indicators. For example, using the data from FIG. 9 and as illustrated in FIG. 11, the Handle Bar Assembly and Pedal Assembly may be overlayed with a visual indicator that the groupings of parts are overweight. Continuing with the example, the wheels may be overlayed with a visual indicator that the wheels are on target, and the frame may be overlayed with a visual indicator that the frame is underweight. The drop-down selector 1106 can be used to render similar views for other criteria, such as compliance and quality.

In another example, the knowledge of the mapping of parts of the CAD drawing to the corresponding part object data, such as business intelligence data used to derive pie charts and tables illustrated at 906 in FIG. 9, can be used with the AutoVue plugin's visualization capabilities to make this experience richer for the user.

For example, the system can pass on the following information to the visualization engine (e.g. AutoVue), as follows:

TB00024.asm corresponds to "Frame Assembly"
For Frame Assembly, here are some attribute values:
Material=Polyurethane
Weight=2 lbs
Compliance=RoHS
For Frame Assembly, color coding for "Weight" category may be Blue for underweight and for "Compliance" category is Green to indicate it the frame is compliant.

With the information, the following interactions may be possible:

(a) Display design with analytics overlayed on the visualization (b) Allow user to view information on parts and collaborate on problem areas (c) Allow user to drill down into the product design using the visualization as the primary navigation mechanism.

Continuing with the example, with a mapping of visualization data to object data, information about the part can be passed to the AutoVue visualization engine, and allow the engine to overlay the right color coding on the file for each part, thereby rendering the derived business intelligence (e.g. weight distribution). This may allow the user to get a nearly realistic feel for whether the bike is balanced, and also which parts need attention.

Figure 12:
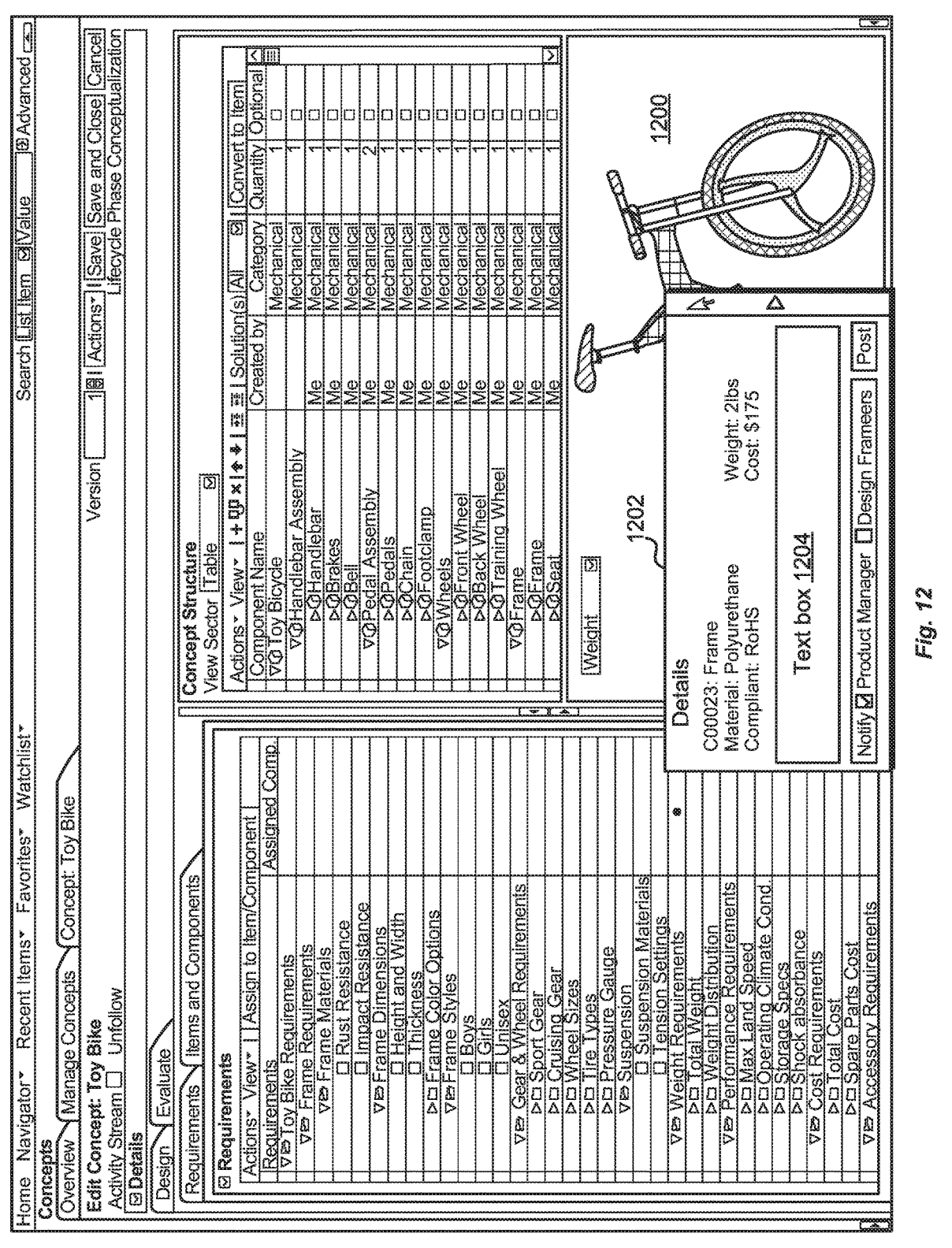

FIG. 12 illustrates an example of a user interface for an implementation of collaboration within a visualization application. FIG. 12 illustrates a user interface with a rendering of a visualization of an object concept 1200 with overlays of shading representing the object data (e.g. business intelligence data). Hovering the mouse on top of any part of the image, as illustrated in FIG. 12, may indicate a request to display details, for example as shown at 1202, about that part. In an embodiment, the background for the display of detail (e.g. at 1202) may be color coded or shaded in the same color/shading as that for the part.

A message box/text box 1204 is displayed in which the user can type-in collaboration data, such as comments, and post them to a discussion pertaining to that design. Specific users may also be notified of this user's comment. For example, alerts may be sent to users that are designated to receive collaboration data for the particular part.

Figure 13:
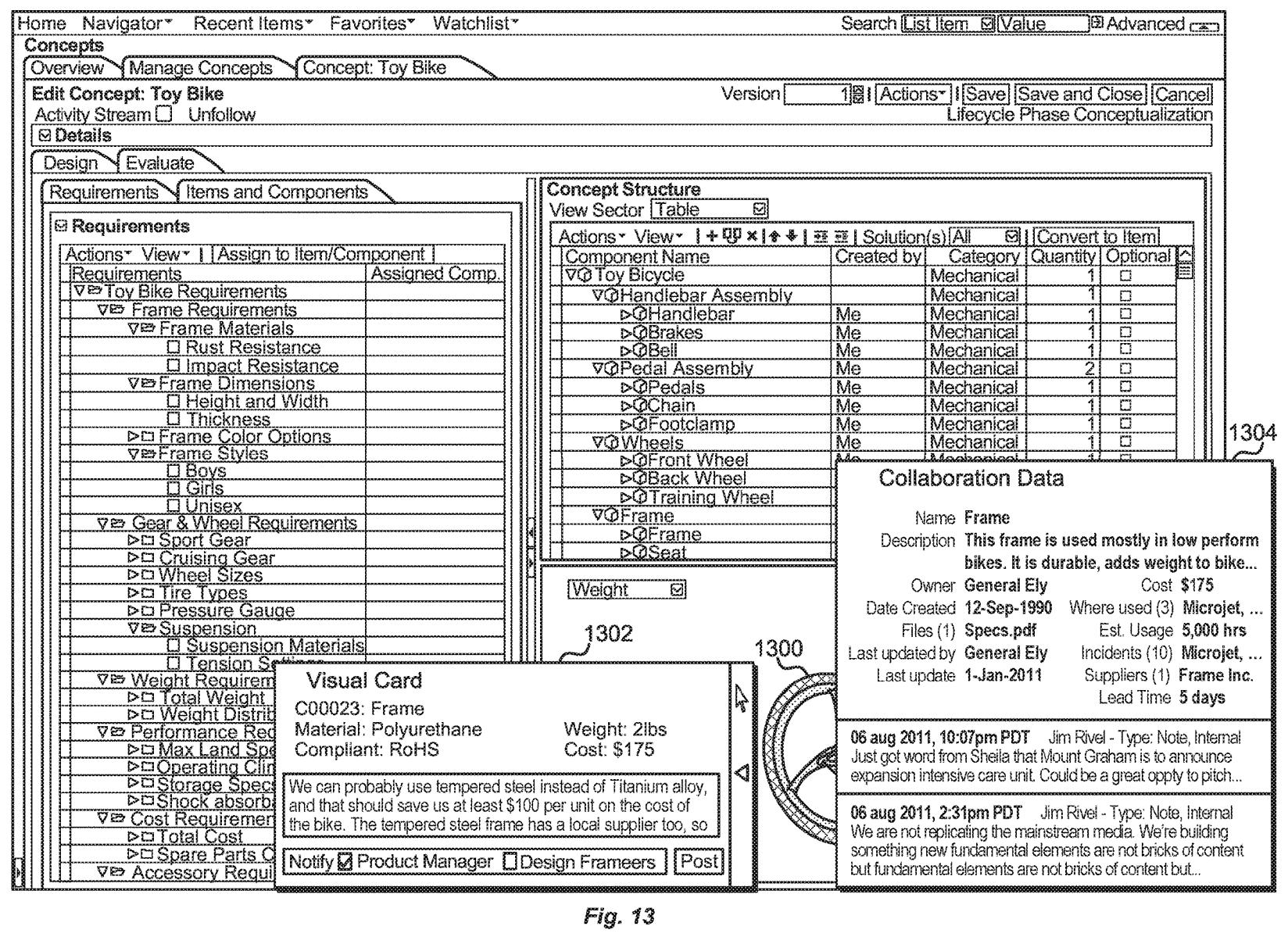

FIG. 13 illustrates an example of a user interface for an implementation of collaboration within a visualization application. FIG. 13 illustrates a user interface with a rendering of a visualization of an object concept 1300 with overlays of shading/cross-hatching representing the object data (e.g. business intelligence data). In an embodiment, clicking the right arrow icon on a part serves as a request to display collaboration data for the part. In response to the request, a visual card may be displayed with more information about the part, for example, as shown at 1302, and collaboration data, for example, as shown at 1304, for the part.

As shown at 1304, collaboration data such as comments from other users associated with the part may be displayed. A mapping may be provided between the collaboration data and the visualization data for the part to ensure the associated collaboration data for the part is displayed.

Figure 14:
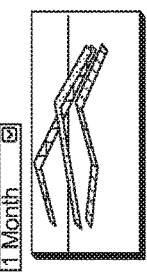
FIG. 14 illustrates an example of a user interface for an implementation of collaboration within a visualization application.

FIG. 14 illustrates an example of a user interface for an implementation of collaboration within a visualization application. Collaboration data shared by one or more users may be displayed in a user interface for displaying information about a product concept(s) 1400. As shown in FIG. 14, an Activity Stream 1402 may be displayed within the user interface with comments from users (e.g. illustrated at 1406) on one or more products. The comments may be viewed by others that are working on the same concept. Users can respond to comments and/or share collaboration data by inputting collaboration data (e.g. as illustrated with text box 1410) and submitting the data for addition to the Activity Stream 1402 (e.g. button 1408). A team discussion may ensue, possibly prompting design enhancements.

In an embodiment, one or more users may be identified for notification on collaboration data for a part. For example, if a user posts a comment, users could be notified if other users have previously posted a comment and/or the users are identified as users to receive notification on collaboration data for a particular part/group of parts.

In another embodiment, a determination could be made as to who the project manager is for a particular part (e.g. object data may associate a manager name with a part) and the manager can be notified about any collaboration data associated with a part. As shown in FIG. 12, a project manager and /or design engineers can be notified, for example, by using an interface as illustrated in Details 1202. The object data for the part may have the project manager's name to allow for retrieval of the name of project manager. As shown in FIG. 13, if a user that put in a comment, then a project manager and/or design engineers can be notified, for example, by using an interface as illustrated in Visual Card 1302.

In another embodiment, the user interface may provide link to start a collaboration session (e.g. chat/collaboration session, web conference) and the object data associated with the part may have a list of people that would have an interest in a collaboration session on the part/design. A user may be provided the option to look at a group of persons associated with product/part and can choose who to invite from those persons. In a collaboration session, new parts could be added for discussion and a discussion on various design options can ensue in the collaboration session. Although a collaboration session is provided as an example, those with skill in the art will recognize that collaboration sessions may include, but are not limited to, the following: a phone conference, VOIP call, an email, or any other form of communication.

Figure 15:
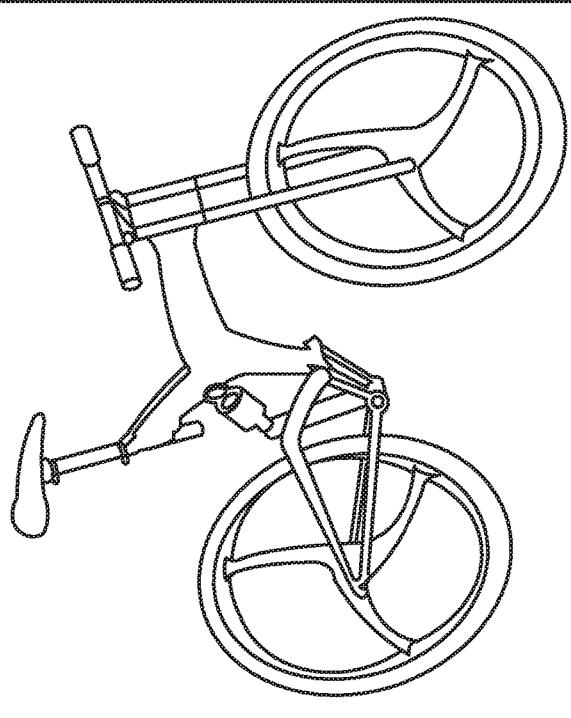
FIG. 15 illustrates an example of a user interface for an implementation of collaboration within a visualization application.

FIG. 15 illustrates an example of a user interface for an implementation of collaboration within a visualization application. FIG. 15 illustrates a user interface with a rendering of a visualization of an object concept 1500. One or more options (e.g. 1502, 1504, 1506, and 1508) for a particular part may be displayed with the visualization to facilitate switching out parts. A recommendation engine may be used to present options for a particular part.

A user can search for a replacement part by leveraging visualization with the overlay of visual indicators to identify the parts to replace. Users can collaborate by sharing collaboration data on the proposed part replacement. For example, users can look at other frames and determine which has a higher weight. Icons (e.g. 1502, 1504, 1506, and 1508) can be used for each potential part available for selection. Optionally, a user can initiate a change order request and send out alerts to one or more users indicating the change order request.

Figure 16:
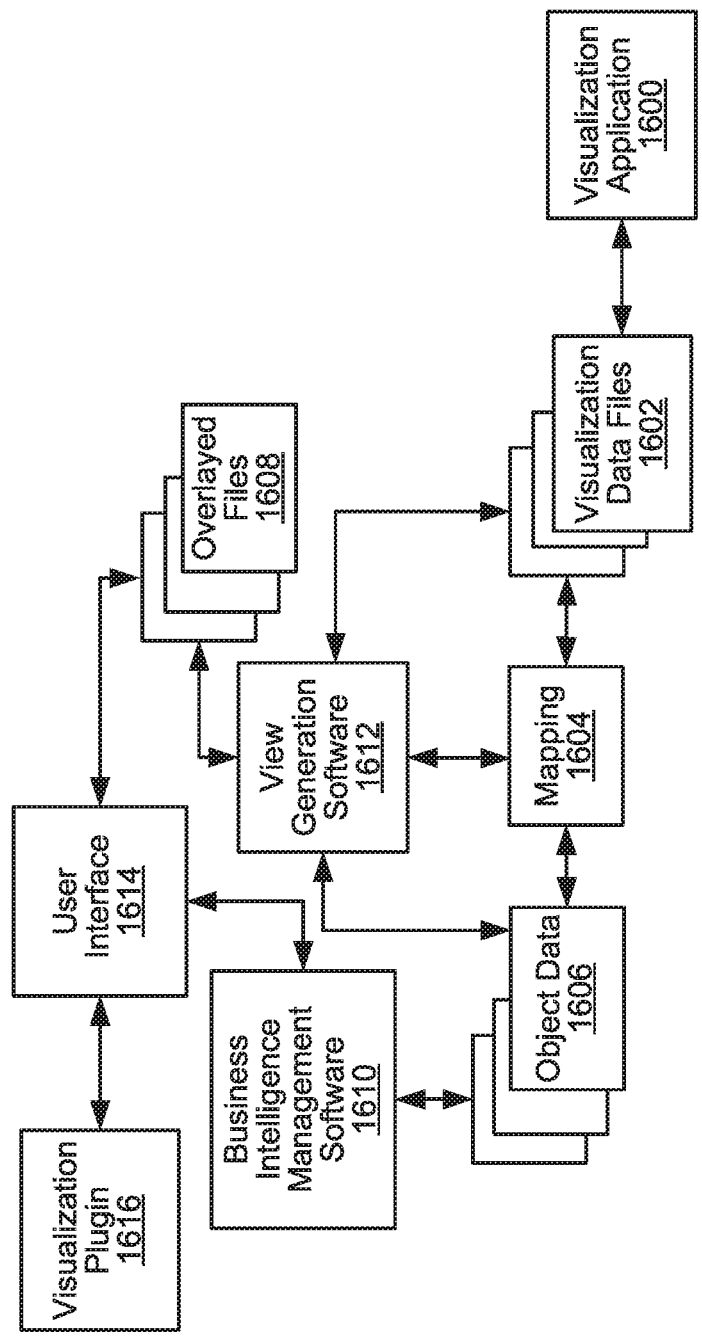
FIG. 16 illustrates an example of a system diagram for an implementation of overlaying product information and/or business intelligence data on a product design visualization.

FIG. 16 illustrates an example of a system diagram for an implementation of overlaying product information and/or business intelligence data on a product design visualization. A Visualization Application 1600 may be use to create one or more Visualization Data File(s) 1602 for a visualization of a product. For example, a CAD system may be used as a Visualization Application 1600 to create CAD visualization data files.

A mapping may be created between one or more of the Visualization Data File(s) 1602 and the Object Data 1606. The mapping may consist of associations between portions of Object Data 1606 files and portions of Visualization Data Files 1602. For example, a programming construct of a reference may be used to refer to data in an object data file may be associated with a reference to data in Visualization Data File 1602. View Generation Software 1612 may be used to create the mappings and generate the Overlayed File(s) 1608, which are visualization files with overlayed visual indicators for a particular view of the object data (e.g. business intelligence data). In an embodiment, the View Generation Software 1612 may make copies of the Visualization Data File(s) 1602 with additional data for overlaying the visual indicators for business intelligence data.

In another embodiment, mappings may be made between Object Data 1606 and Overlayed File(s) 1608. Overlayed File(s) 1608 are files that are visualization data files that can render the visualization for the object with visual indicators overlayed onto the visualization for the Object Data 1606.

Business Intelligence Management Software 1610 may be used to manage the Object Data 1606. The Business Intelligence Management Software 1610 may have User Interface 1614 that utilizes a Visualization plugin 1616 to render the visualization with overlays using the Overlayed File(s) 1608. The Business Intelligence Management Software 1610 may be a visualization application with ability to render visualizations.

Although the description has been described with respect to particular embodiments thereof, these particular embodiments are merely illustrative, and not restrictive.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

Particular embodiments may be implemented in a computer-readable storage device for use by or in connection with the instruction execution system, apparatus, system, or device. Particular embodiments can be implemented in the form of control logic in software or hardware or a combination of both. The control logic, when executed by one or more processors, may be operable to perform that which is described in particular embodiments.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium, such as a storage device, to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

I claim:

1. A method for collaboration using a visualization application, wherein the method is executing on a computer system, wherein the computer system comprises one or more processors coupled to a display screen, a computer readable memory and at least one input device, the method comprising:
   storing, performed by the computer system, mappings of one or more Computer Aided Design (CAD) files to parts of a product;
   rendering, in a user interface on the display screen, an image of a concept design of the product that depicts the parts assembled with respect to each other, wherein the rendering is performed by the computer system and based directly on the one or more CAD files;
   associating, performed by the computer system, visual indicators with the concept design of the product, wherein there is a one to one correspondence between the visual indicators and the parts and wherein each of the visual indicators pertains to a relationship between the part associated with that visual indicator and other parts of the concept design of the product;
   for each of the parts, overlaying, in the user interface on the display screen, the visual indicator associated with a respective part, wherein the overlaying is performed by the computer system;
   comparing, performed by the computer system, actual object data for a particular part of the concept design with target data for the product, wherein the particular part represents an assembled part of the product and is a subset of the concept design;
   storing, performed by the computer system, a difference between the actual object data and the target data as business intelligence data associated with the particular part, wherein the difference pertains to distribution of weight across the product;
   displaying, performed by the computer system, the difference in the user interface on the display screen;
   receiving a request to change a specified part of the product;
   automatically determining alternative part options; and
   collaborating on changing the distribution of weight across the product, at least in part, by sending the alternative part options to other users of the computer system, wherein the distribution of weight across the product is changed by replacing the specified part with one of the alternative part options.

2. The method as recited by claim 1, wherein the method further comprises: receiving, at the user interface, selection of a part by a user.

3. The method as recited by claim 2, wherein the method further comprises: requesting collaboration data for the selected part; and displaying, on the user interface, the collaboration data for the selected part, wherein the collaboration data includes user thoughts and suggestions with respect to the selected part.

4. The method as recited by claim 2, wherein the method further comprises: displaying, at the user interface, drill down information associated with the selected part.

5. The method as recited by claim 2, wherein the user is a first user and the method further comprises: receiving, at the user interface, first collaboration data provided by the first user with respect to the selected part.

6. The method as recited by claim 5, wherein the method further comprises: displaying, on the user interface, second collaboration data shared by a second user.

7. The method as recited by claim 6, wherein the method further comprises: notifying a manager about the collaboration data.

8. The method as recited by claim 6, wherein the method further comprises: during a collaboration session, receiving the first collaboration data and the second collaboration data; and displaying, on the user interface, the first collaboration data and the second collaboration data shared by the first user and the second user.

9. The method as recited by claim 8, wherein the method further comprises: displaying, on the user interface, discussions of design options provided by users viewing the concept design of the product during the collaboration session.

10. The method as recited by claim 8, wherein the method further comprises: changing at least one part of the concept design during the collaboration session; and updating display of the concept design on the user interface based on the changing of the at least one part.

11. The method as recited by claim 1, wherein the method further comprises: storing associations between the visual indicators and the one or more CAD files.

12. The method as recited by claim 1, wherein the overlaying of the visual indicator further comprises: displaying, on the user interface, an impact of the respective part with respect to the other parts on the design concept.

13. The method as recited by claim 1, wherein the method further comprises: associating the difference with the visual indicator of the particular part.

14. The method as recited by claim 1, wherein the method further comprises:
associating the one or more CAD files in a hierarchy collection, wherein the hierarchy collection is associated with instruction on how to assemble the parts into the concept design;
using the instructions to determine how to assemble the parts into the concept design; and
displaying, on the user interface, the concept design determined using the instructions.

15. The method as recited by claim 1, wherein the method further comprises: displaying business intelligence data for a part, wherein the business intelligence data is selected from a group consisting of applicability for use by children, expected manufacturing cost, expected manufacturing weight, power associated with the part, risk associated with the part, and one or more factors for evaluating the part.

16. The method as recited by claim 1, wherein the method further comprises: displaying, on the user interface, a visualization of the concept design with analytics overlaid on the concept design; enabling a user to view information about the parts and collaborate with other users on problem areas of the concept design; and allowing the user to drill down into the concept design using visualization as a primary navigation mechanism.

17. A non-transitory computer readable media having one or more instructions thereon for collaboration using a visualization application, the instructions when executed by one or more processors performing the acts of:
storing, performed by a computer system, mappings of one or more Computer Aided Design (CAD) files to parts of a product;
rendering, in a user interface on a display screen, an image of a concept design of the product that depicts the parts assembled with respect to each other, wherein the rendering is performed by the computer system and based directly on the one or more CAD files;
associating, performed by the computer system, visual indicators with the concept design of the product, wherein there is a one to one correspondence between the visual indicators and the parts and wherein each of the visual indicators pertains to a relationship between the part associated with that visual indicator and other parts of the concept design of the product;
for each of the parts, overlaying, in the user interface on the display screen, the visual indicator associated with a respective part, wherein the overlaying is performed by the computer system;
comparing, performed by the computer system, actual object data for a particular part of the concept design with target data for the product, wherein the particular part represents an assembled part of the product and is a subset of the concept design;
storing, performed by the computer system, a difference between the actual object data and the target data as business intelligence data associated with the particular part, wherein the difference pertains to distribution of weight across the product;
displaying, performed by the computer system, the difference in the user interface on the display screen;
receiving a request to change a specified part of the product;
automatically determining alternative part options; and
collaborating on changing the distribution of weight across the product, at least in part, by sending the alternative part options to other users of the computer system, wherein the distribution of weight across the product is changed by replacing the specified part with one of the alternative part options.

18. An apparatus for overlaying business intelligence data on a product design visualization, the apparatus comprising:
a computer readable memory;
one or more processors of a computer system; and
logic encoded in one or more tangible media for execution by the one or more processors for:
storing, performed by the computer system, mappings of one or more Computer Aided Design (CAD) files to parts of a product;
rendering, in a user interface on a display screen, an image of a concept design of the product that depicts the parts assembled with respect to each other, wherein the rendering is performed by the computer system and based directly on the one or more CAD files;
associating, performed by the computer system, visual indicators with the concept design of the product, wherein there is a one to one correspondence between the visual indicators and the parts and wherein each of the visual indicators pertains to a relationship between the part associated with that visual indicator and other parts of the concept design of the product;
for each of the parts, overlaying, in the user interface on the display screen, the visual indicator associated with a respective part, wherein the overlaying is performed by the computer system;
comparing, performed by the computer system, actual object data for a particular part of the concept design with target data for the product, wherein the particular part represents an assembled part of the product and is a subset of the concept design;
storing, performed by the computer system, a difference between the actual object data and the target data as business intelligence data associated with the particular part, wherein the difference pertains to distribution of weight across the product;
displaying, performed by the computer system, the difference in the user interface on the display screen;
receiving a request to change a specified part of the product;
automatically determining alternative part options; and
collaborating on changing the distribution of weight across the product, at least in part, by sending the alternative part options to other users of the computer system, wherein the distribution of weight across the product is changed by replacing the specified part with one of the alternative part options.

19. The method of claim 1, further comprising:
associating, performed by the computer system, weight data with each of the parts, where in the actual object data includes weight data for the particular part;
comparing, performed by the computer system, the weight data for each of the parts with the target data for the product;

categorizing, performed by the computer system, the parts as overweight, underweight, and on target based on the comparing of the weight data with the target data;

automatically determining, performed by the computer system, part options for parts that are categorized as overweight and underweight; and displaying, performed by the computer system, the weight data for each of the parts, different visual indicators for the parts based on the categorizing, and the automatically determined part options in the user interface on the display screen.

20. The method of claim 1, wherein the method further comprises:

receiving one or more visualization data files including product design visualization data for rendering a visualization of shapes of the parts of the product, with the product having at least first and second parts and with each part of the product represented by a corresponding portion of the product design visualization data;

displaying, by the one or more processors, the visualization of the first and second parts of the product;

completely overlaying, within the visualization and by the one or more processors, only the shape of the first part of the product with a first non-text visual indicator pattern;

completely overlaying, within the visualization and by the one or more processors, only the shape of the second part of the product with a second non-text visual indicator pattern; and displaying, by the one or more processors, a guide that indicates which type of business intelligence data is indicated by the first non-text visual indicator pattern completely overlaying the shape of the first part of the product, and that indicates which type of business intelligence data is indicated by the second non-text visual indicator pattern completely overlaying the shape of the second part of the product;

wherein a part characteristic is one of resistance to breakage, cost, weight, or applicability for use by children;

business intelligence data is received as one or more files stored in one or more of a database, a hierarchy of files and a directory of files;

the first non-text visual indicator pattern is a first cross-hatch pattern and the second non-text visual indicator pattern is a second cross-hatch pattern;

rendering the visualization using the one or more computer aided design (CAD) files; and adding a copy of a non-text visual indicator pattern to the CAD files, with the CAD files including assembly files for assembling parts and part files for particular parts.

* * * * *